United States Patent
Brandl et al.

(10) Patent No.: US 12,128,821 B2
(45) Date of Patent: Oct. 29, 2024

(54) LIGHT EMITTING DEVICE AND INTERIOR CLADDING OR CLADDING ELEMENT WITH A LIGHT EMITTING DEVICE

(71) Applicant: OSRAM Opto Semiconductors GmbH, Regensburg (DE)

(72) Inventors: Michael Brandl, Mintraching (DE); Peter Brick, Regensburg (DE); Uli Hiller, Bad Abbach (DE); Sebastian Stigler, Obertraubling OT Scharmassing (DE); Armin Wetterer, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 171 days.

(21) Appl. No.: 17/430,855

(22) PCT Filed: Feb. 12, 2020

(86) PCT No.: PCT/EP2020/053664
§ 371 (c)(1),
(2) Date: Aug. 13, 2021

(87) PCT Pub. No.: WO2020/165292
PCT Pub. Date: Aug. 20, 2020

(65) Prior Publication Data
US 2022/0126749 A1    Apr. 28, 2022

(30) Foreign Application Priority Data
Feb. 13, 2019    (DE) ..................... 10 2019 103 580.5

(51) Int. Cl.
*B60Q 3/62*    (2017.01)
*B60Q 3/54*    (2017.01)
(Continued)

(52) U.S. Cl.
CPC ................. *B60Q 3/62* (2017.02); *B60Q 3/54* (2017.02); *B60Q 3/745* (2017.02); *B60R 13/02* (2013.01);
(Continued)

(58) Field of Classification Search
CPC . B32B 2307/40; B32B 2551/00; B32B 7/023; B32B 17/10485; B60Q 3/62;
(Continued)

(56) References Cited

U.S. PATENT DOCUMENTS 4,234,907 A * 11/1980 Daniel .................. B63H 9/067
                                                        362/108
4,885,663 A * 12/1989 Parker .................... G02B 6/001
                                                        362/330

(Continued)

FOREIGN PATENT DOCUMENTS

DE    102 06 613 A1    8/2003
DE    102015113654 A1 *    3/2016    ............. B60N 2/002
(Continued)

OTHER PUBLICATIONS

Yarn definition, Textile Glossary, Celanese Acetate, copyright 2002 (Year: 2002).*

(Continued)

*Primary Examiner* — Jennifer A Steele
(74) *Attorney, Agent, or Firm* — HAUPTMAN HAM, LLP

(57) ABSTRACT

A light emitting device includes a radiation source for the emission of electromagnetic radiation and a converter element on which the electromagnetic radiation impinges in a first surface region and which, excited by the impinged electromagnetic radiation, emits visible light into an environment in a second surface region which differs at least partially from the first surface region. The wavelength of the (Continued)

Figure 1:
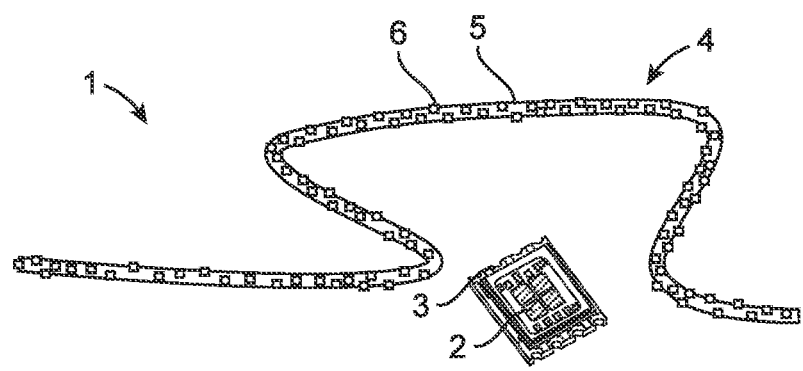

light emitted into the environment differs from the wavelength of the electromagnetic radiation impinged on the converter element. The converter element includes a luminous element including a textile with a converter material. The converter material due to excitation by the electromagnetic radiation with a first wavelength emits visible light with a second wavelength differing from the first wavelength. The radiation source realizes a background illumination for the converter element. The first surface region is formed by a side surface or a back surface of the converter element.

20 Claims, 4 Drawing Sheets

(51) Int. Cl.
    *B60Q 3/74*     (2017.01)
    *B60R 13/02*     (2006.01)
    *D03D 15/547*     (2021.01)
    *D06N 3/00*     (2006.01)

(52) U.S. Cl.
    CPC ......... *D03D 15/547* (2021.01); *D06N 3/0002* (2013.01); *D06N 2201/00* (2013.01); *D06N 2209/0892* (2013.01); *D10B 2401/18* (2013.01); *D10B 2401/20* (2013.01); *D10B 2403/02431* (2013.01)

(58) Field of Classification Search
    CPC .... B60Q 3/745; B60Q 1/0035; B60Q 1/2619; B60Q 3/12; B60Q 3/20; B60Q 3/54; B60R 13/02; B60R 2013/0287; D03D 15/547; D06N 3/0002; D06N 2201/00; D06N 2209/0892; D10B 2401/18; D10B 2401/20; D10B 2403/02431

See application file for complete search history.

(56) References Cited

U.S. PATENT DOCUMENTS

| | | | |
|---|---|---|---|
| 2012/0189958 A1 | 7/2012 | Chang et al. | |
| 2015/0197186 A1* | 7/2015 | Salter | B60Q 3/80 362/510 |
| 2018/0257553 A1* | 9/2018 | Salter | B60Q 3/68 |

FOREIGN PATENT DOCUMENTS

| | | | | |
|---|---|---|---|---|
| DE | 102015114690 A1 * | 3/2016 | | B60Q 3/0243 |
| DE | 10 2016 212 817 A1 | 1/2018 | | |
| DE | 10 2017 101 769 A1 | 8/2018 | | |
| DE | 10 2017 108 580 A1 | 10/2018 | | |
| GB | 2427955 A * | 1/2007 | | B60Q 3/004 |
| WO | WO-2008125339 A2 * | 10/2008 | | D02G 3/18 |

OTHER PUBLICATIONS

Visible Light Spectrum, Wikipedia, downloaded May 20, 2023 (Year: 2023).*
Machine Translation of DE102015114690 (Year: 2016).*
International Search Report issued for corresponding International Patent Application No. PCT/EP2020/053664 on May 11, 2020, along with an English translation.
Written Opinion issued for corresponding International Patent Application No. PCT/EP2020/053664 on May 11, 2020.

* cited by examiner

LIGHT EMITTING DEVICE AND INTERIOR CLADDING OR CLADDING ELEMENT WITH A LIGHT EMITTING DEVICE

CROSS REFERENCE TO RELATED APPLICATION

This application is a National Stage of International Application No. PCT/EP2020/053664, filed on Feb. 12, 2020, which designates the United States and was published in Europe, and which claims priority to German Patent Application No. 10 2019 103 580.5, filed on Feb. 13, 2019, in the German Patent Office. Both of the aforementioned applications are hereby incorporated by reference in their entireties.

This patent application claims the priority of the German application DE 10 2019 103 580.5, the disclosure content of which is hereby incorporated by reference.

The invention relates to a light emitting device with a radiation source and a converter element as well as to an interior cladding or a cladding element with such a light emitting device.

Various solutions are known from the prior art, with which a pleasant atmosphere is to be created in the interior, in particular in the interior of vehicles, or orientation within the space is to be improved. The known light emitting devices regularly have light-emitting semiconductor components, in particular LEDs, with which particularly space-saving light emitting devices can be provided that are adapted to the contour of the respective component that accommodates the light emitting device. In addition, such light emitting devices are characterized by low energy requirements and high efficiency in terms of luminous efficacy. A further advantage of such light emitting devices is that light can often be emitted with different colors and intensities as required in the space to be illuminated.

In this context, an optoelectronic fiber is known from DE 10 2017 101 769 A1, which on the one hand can be manufactured at comparatively low cost and on the other hand can be further processed using conventional textile processing methods. The optoelectronic fiber essentially has two electrically conductive wires arranged next to one another and an optoelectronic component connected to them. The optoelectronic component is both controlled and supplied with the required electrical energy via the two wires. A significant feature of the technical solution described is that the wires and also the optoelectronic component are surrounded by an at least partially transparent coating, so that in this way a closed fiber with a luminous element is provided.

Furthermore, a fabric with a special radiation-emitting semiconductor component is known from DE 10 2017 108 580 A1, which is preferably designed as a thin-film light-emitting diode. The carrier on which the respective luminous element is located has, on its underside facing away from the semiconductor layer sequence, an anchoring structure which is configured to receive at least one thread for electrical contacting. In the following, a fabric is described which is connected to at least one such thread for contacting a luminous element.

Based on the known technical solutions, the invention is based on the object of specifying a light emitting device which can be adapted particularly effectively to different contours, for example to the contours of cladding elements for vehicles or components. For this purpose, the technical solution to be provided should comprise a structure that is as flexible as possible, enabling it to be used without having to make special modifications to the light emitting device. In particular, it should be possible to provide especially small, space-saving and line-supporting light emitting devices with different shapes, which are preferably suitable for the illumination of a device or an interior space both during the day and in the dark. In this respect, the light emitting device to be provided should enable both the suitable illumination of a functional component, such as a switch, the realization of light emitting objects that are aesthetically pleasing, and the production of luminous elements that simplify orientation in a space.

Furthermore, such a light emitting device should be adaptable in a comparatively simple way with regard to the characteristics of the emitted light radiation to the different customer needs, especially with regard to the color as well as the intensity of the emitted light. Furthermore, it should be possible to display patterns and lettering, and the light emitting device should be highly resistant to external influences such as mechanical loads, dirt or moisture. In addition, the technical solution to be provided should provide a light emitting device that enables comparatively inexpensive production on an industrial scale.

The aforementioned object is solved with a light emitting device according to claim 1. Furthermore, in claims 19 and 20, cladding elements are indicated which use a light emitting device according to the invention. Advantageous embodiments of the invention are subject of the dependent claims and are explained in more detail in the following description with partial reference to the figures.

The invention relates to a light emitting device comprising at least one radiation source for emitting electromagnetic radiation and comprising a converter element on which the electromagnetic radiation impinges in a first surface region. The converter element emits, excited by the electromagnetic radiation in at least a second surface region which differs at least partially from the first surface region, i.e. at least partially does not overlap with the latter, visible light into the environment via a visible surface facing the environment of the light emitting device, the wavelength of the visible light emitted into the environment differing from the wavelength of the electromagnetic radiation impinging on the converter element. According to the invention, the light emitting device has been further developed in such a way that the converter element comprises at least one luminous element comprising a textile and/or a plastic with at least one converter material, wherein the converter material, due to excitation by the electromagnetic radiation with a first wavelength emits visible light with a second wavelength different from the first wavelength. The essential idea of the invention is thus that the converter element comprises a luminous element with a textile and/or with a plastic, on or in which a special converter material is arranged, which due to the excitation by electromagnetic radiation with a first wavelength emits visible light with a wavelength different from the first wavelength. In this case, it is provided that the visible light is emitted via a surface region of the luminous element which is different from the surface region on which the excitation radiation emitted by the radiation source has impinged. This design or arrangement of the converter element with its luminous element in relation to the radiation source has the advantage that a background illumination is realized in a particularly suitable manner, in which the radiation emanating from the radiation source impinges on a side surface or on the back surface of the converter element and the converter element thereupon emits visible light into the environment via the visible surface of the light emitting device. An observer located in the environment therefore perceives the light emitted via the visible surface, for example in the form of a pattern, but not the radiation source located behind it.

In addition, the arrangement of the converter material on and/or in the luminous element of the converter element, which comprises a textile and/or a plastic, according to the invention, offers the possibility of providing a particularly flexible, preferably linear and/or particularly thin-walled luminous element with or without a special pattern, which can be adapted comparatively easily to different geometries of a component into which the light emitting device is to be integrated or to which the light emitting device is to be fastened. Preferably, the textile and/or the plastic material used in each case is transparent or at least translucent for the incident excitation radiation and/or the emitted visible light.

According to at least one embodiment of the invention, it may be provided that the radiation source and/or the converter element, in particular laterally, does not require a light guiding material, such as a glass fiber. Furthermore, it may be provided that the converter element comprises no electrical infrastructure in the region visible to an observer from which light emerges.

The radiation source can be arranged at a spatial distance from the converter element and serve, for example, as indirect lighting, in particular background lighting, for the converter element. Due to an excitation of the converter element by the electromagnetic radiation emitted by the radiation source arranged at a distance, the converter element can emit, for example, visible light into the environment, the wavelength of the visible light being different from the wavelength of the electromagnetic radiation incident on the converter element.

According to at least one embodiment of the invention, a light emitting device may comprise at least one radiation source for emission of electromagnetic radiation and a converter element, wherein the radiation source realizes a background illumination for the converter element and is arranged in such a way that the radiation emanating from the radiation source impinges on a side surface and/or on a back surface of the converter element and the converter element thereupon emits visible light into the environment via a visible surface of the light emitting device, wherein the wavelength of the light emitted into the environment differs from the wavelength of the electromagnetic radiation impinging on the converter element, wherein the converter element comprises at least one luminous element which comprises a textile and/or a plastic with at least one converter material, wherein the converter material emits due to excitation by the electromagnetic radiation with a first wavelength visible light with a second wavelength differing from the first wavelength. The environment means in particular the spatial region which is not located in front of the side surface and/or the back surface.

According to a particular further development of the invention, it is provided that the luminous element comprises a thread, a yarn, a twine and/or a rope on or in which the converter material is arranged. In this context, it becomes clear that the luminous element preferably comprises a particularly flexible material on or in which the converter material is arranged. It is of great advantage in this embodiment if so-called continuous material, in particular continuous filaments, are used to manufacture a luminous element. Of course, it is conceivable in this context that a converter element is manufactured by suitable processes for the production of textile material, for example by knitting, felting and/or weaving, whereby a converter element can comprise a plurality of luminous elements, each of which comprises at least one thread.

In a further embodiment of the invention, the luminous element comprises a woven fabric, a knitted fabric, a woven fabric, a non-woven fabric and/or a felt, on and/or in which the converter material is arranged. The luminous element used according to this embodiment is thus a flexible textile piece which has preferably been made, for example by weaving, from a plurality of threads. The advantage of textile material is above all that large quantities of flexible luminous elements can be manufactured at comparatively low cost, which can be adapted particularly easily to different shapes or contours.

Furthermore, it is generally conceivable for the luminous element to have as a material a plastic, in particular an acrylonitrile butadiene styrene (ABS), a polyethylene terephthalate (PET) and/or a polyurethane (PU), in or on which the converter material is arranged. If a plastic is used to manufacture a luminous element, it is advantageous if the luminous element is designed with such thin walls, for example as a thin strip, so that it can in turn be adapted particularly easily to the required contour. In general, it is also conceivable in this context to use a suitable plastic that is transparent or at least translucent, in particular for radiation or light with the relevant wavelength, to provide or coat it with a converter material and then to use it for a light emitting device with a radiation source arranged in the background, which is inserted into the outer skin of an electrical device or into an interior cladding element of a land vehicle, watercraft or aircraft.

Essential for the realization of a luminous element comprising a plastic material is that the plastic material is transparent or at least translucent, so that the excitation radiation and/or the generated visible light can at least partially radiate through the luminous element.

According to a preferred embodiment of the invention, the converter material is at least partially arranged on a surface of the luminous element. Preferably, the converter material has been applied to the surface of the luminous element by means of a suitable coating and/or printing process. Preferably, the converter material is located on the entire surface of the luminous element or is at least evenly distributed over the surface of the luminous element.

If the converter material is not located on the entire surface of the luminous element, it is again advantageously provided that the luminous element comprises a material which is transparent or at least translucent, so that both the excitation of the converter material by the electromagnetic radiation emanating from the radiation source and the emission of visible light into the environment can take place. In this context, it is conceivable that the luminous element, for example a filament, is fully coated or printed with a converter material. Thus, it is conceivable that a suitable converter material is vapor-deposited, sprayed and/or printed in the form of an ink containing at least the converter material onto a surface of the luminous element.

In a further preferred embodiment of the invention, the converter material is arranged at least partially within the luminous element. Such an arrangement of the converter material within the luminous element can be advantageously achieved by a dyeing and/or impregnating process. It is of particular advantage if the luminous element comprises a textile which is brought into contact with the converter material by means of a conventional dyeing process in such a way that the converter material is distributed at least approximately uniformly within the textile. When using a luminous element manufactured in this way, it is ensured in a special way that a uniform intensity of the visible light emitted into the environment as a result of the excitation is achieved.

Converter materials can be used in an advantageous way and are excited to emit visible light due to the excitation by the electromagnetic radiation emitted by the radiation source. The visible light emitted by the respective selected converter material, more precisely the wavelength of the emitted light, regularly depends on the wavelength of the excitation radiation and the selection and composition of the converter material. Preferably, the radiation source is selected such that it emits blue light in a wavelength range of approximately 380 to 490 nm.

Moreover, it may be advantageous if the luminous element is covered, at least in certain areas, by a transparent or translucent protective layer, for example in the form of a coating and/or a plate-shaped cover element. Such a protective layer is located on a side facing away from the luminous element and usually provides the visible surface of the light emitting device facing the environment. With such a protective layer, for example in the form of a coating and/or a preferably flexible substrate, the converter element with the at least one luminous element as well as the radiation source arranged laterally of or behind the converter element with respect to the environment are protected against damage as well as dirt and moisture ingress. If the protective layer is designed as a substrate which covers the converter element and the radiation source arranged next to or behind it relative to the environment, this substrate has a transparent or at least translucent material, in particular a glass, an acrylic glass (PMMA) and/or another transparent or translucent plastic.

According to a further embodiment of the invention, it is provided that the converter element comprises at least two luminous elements, each of which emits visible light with a different wavelength due to excitation by the electromagnetic radiation. In this context, it is again conceivable that the radiation source comprises at least two radiation elements, in particular LEDs, which irradiate the converter element, and in this case the at least two luminous elements, with excitation radiation. An arrangement with several radiation elements and/or luminous elements offers the advantage that light with different wavelengths can be emitted into the environment in a particularly effective manner. Here it is generally conceivable to mix the visible light emitted by the at least two luminous elements in such a way that the desired illumination, possibly with a pattern, of the environment is achieved.

According to a preferred further development, it is provided that the radiation source comprises at least two radiation elements emitting electromagnetic radiation and the converter element comprises at least two luminous elements or one luminous element with at least two non-overlapping luminous regions, and that each radiation element is assigned to one luminous element or one luminous region, respectively, in such a way that the electromagnetic radiation emitted by one of the radiation elements impinges at least almost exclusively on one luminous element or one luminous region, respectively, on which no electromagnetic radiation emitted by another luminous element or luminous region impinges. In relation to the respective beam path of the electromagnetic radiation, discrete pairs consisting of a radiation element and a luminous element are formed in this way, so that the respective luminous element is excited in a very targeted manner to emit visible light of the desired wavelength. In an advantageous manner, technical means are provided in this context, for example in the form of suitable covering, shielding or absorber elements, which prevent the radiation propagating between the elements of such a pair, namely between a radiation element and the luminous element associated therewith, from entering the beam path arranged between another pair formed by a radiation element and a luminous element. Likewise, such means can be provided in the form of suitable cover, shielding or absorber elements in the area of the surface of the luminous elements facing the environment, in order to prevent or at least significantly hinder optical crosstalk of the light emitted in each case by one luminous element into the beam path emanating from an adjacent luminous element.

The radiation source can comprise at least two radiation elements which emit electromagnetic radiation, and the converter element can comprise at least two luminous elements or one luminous element with at least two non-overlapping luminous regions, each radiation element being assigned to a luminous element or a luminous region respectively in such a way that the wavelengths of the electromagnetic radiation emitted by one of the radiation elements are matched to a luminous element or a luminous region. In particular, the "peak" wavelength of the electromagnetic radiation emitted by a radiation element can be tuned to the associated luminous element or the associated luminous region. Thus, a wavelength-dependent assignment can be made between the radiation element and the luminous element. In this way, wavelength-related pairs consisting of a radiation element and a luminous element are formed in order to excite the respective luminous element in a very targeted manner to emit visible light of a desired wavelength with the peak wavelength required for this purpose and matched to the luminous element.

In a further embodiment of the invention, the converter element comprises at least three luminous elements which, due to the excitation by the electromagnetic radiation, each emit light with the primary colors of the RGB color space and thus either red, green or blue light. In this case, the luminous elements are arranged and designed in such a way that light emitted by the luminous elements into the environment is preferably mixed from at least two of the three light colors. In this context, it is preferably conceivable that the respective radiation and/or luminous elements are arranged in such a way and/or that additional optical elements are provided so that the light emitted by the individual luminous elements of the converter element is mixed in a suitable manner.

In a further advantageous embodiment, a cover element is arranged in a beam path between the radiation source and the converter element and/or between the converter element and the environment, at least in some regions, which at least partially absorbs incident radiation. With such a cover element, optical crosstalk of radiation between two beam paths can be reliably avoided.

According to a further embodiment, the radiation source comprises at least one radiation element, in particular at least one LED, which emits electromagnetic radiation with a wavelength of approximately 380 to 490 nm. Blue light is thus emitted by the radiation source or the respective radiation elements of the radiation source, which, according to the invention, is converted by the converter material arranged in or on the converter element, which comprises a textile and/or a plastic, into visible light with the desired wavelength, in particular into red, green or blue light, which is characteristic of the RGB color space. Furthermore, it is conceivable that the radiation source comprises at least two radiation elements, each of which emits radiation of different wavelengths. The peaks of the different wavelengths can, for example, be 10 nm or more apart. It is also conceivable that the converter element comprises at least two luminous elements, on or in each of which different converter materials are arranged.

In a further development of the invention, it is provided that the radiation source comprises at least two radiation elements distant from each other. In this context, it is conceivable that the radiation elements in turn emit electromagnetic radiation with different wavelengths or are paired with luminous elements that have different or partially no converter material. With such an arrangement, it is advantageously possible to realize special patterns or inscriptions, even of different colors, which are emitted into the environment via the visible surface of the light emitting device and can be detected visually by an observer located in the environment.

Furthermore, it is advantageous if at least one light guiding element is provided for guiding, deflecting and/or shaping the electromagnetic radiation emitted by the radiation source and/or the visible light emitted by the converter element. The at least one light guiding element can be both an optical waveguide, with which radiation or light can be guided specifically to different locations, and an optical element, such as a lens or a deflection mirror. In a preferred manner, the at least one light guiding element is in turn combined with at least one suitable cover element, so that a targeted beam guidance and/or shaping is achieved and/or a crosstalk of radiation from one beam path into at least one adjacent beam path is reliably prevented or impeded. Both flat and linear or annular elements, which at least partially absorb or reflect the incident radiation, can be used as cover elements.

Furthermore, the invention relates to an interior cladding of a land, water or air vehicle with a light emitting device which is designed according to at least one of the embodiments explained above. Moreover, it is also conceivable to provide a wall, a wall component or a cladding element for a wall or a component, for example of an electric tool or household appliance, with a light emitting device designed according to the invention.

Figure 2:
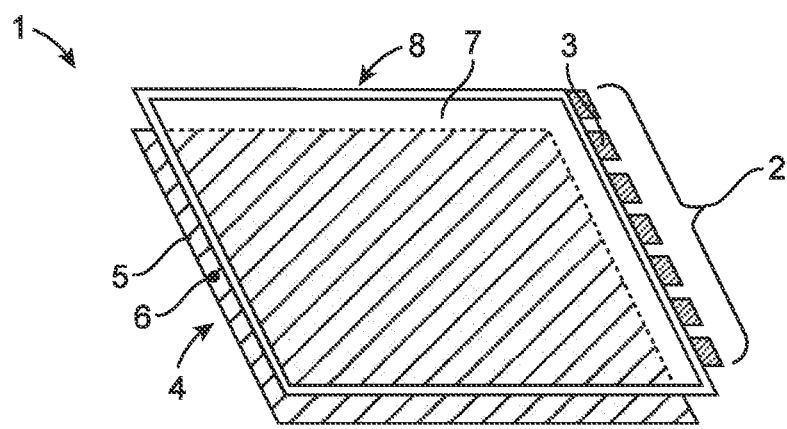
Figure 3:
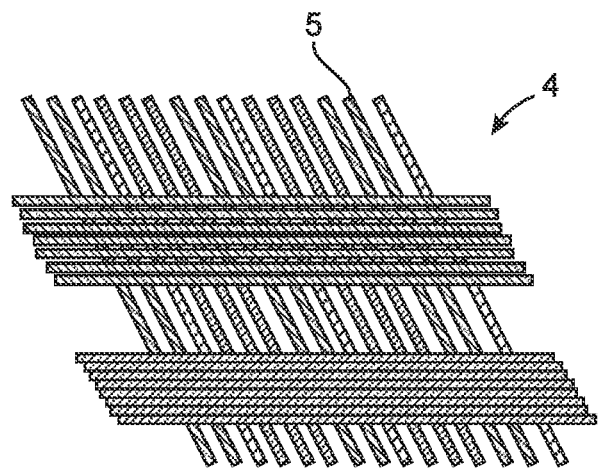
Figure 4:
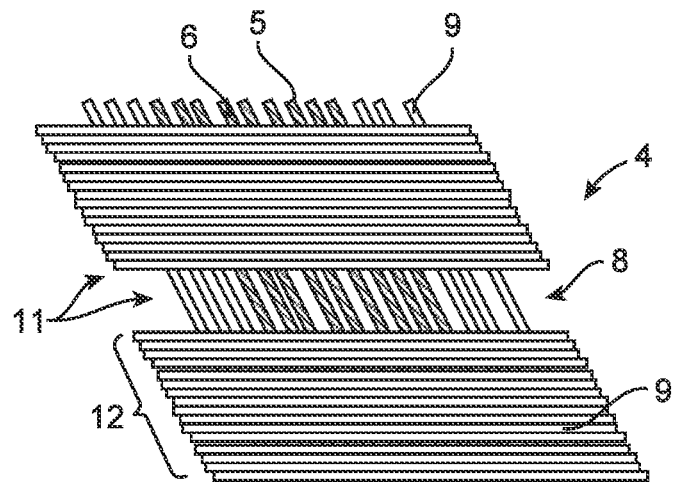
Figure 5:
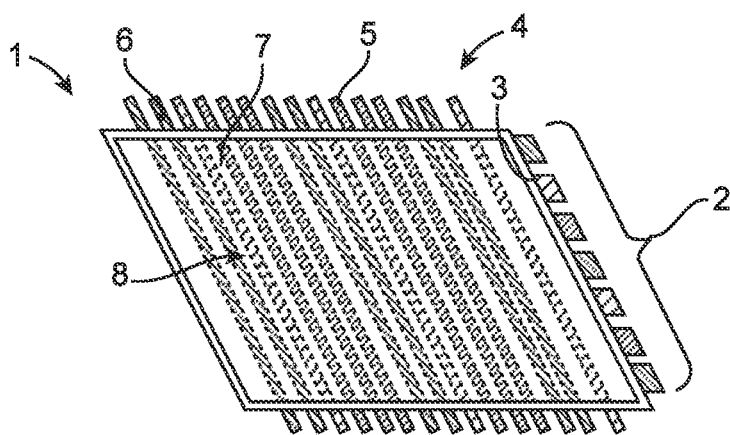
Figure 6:
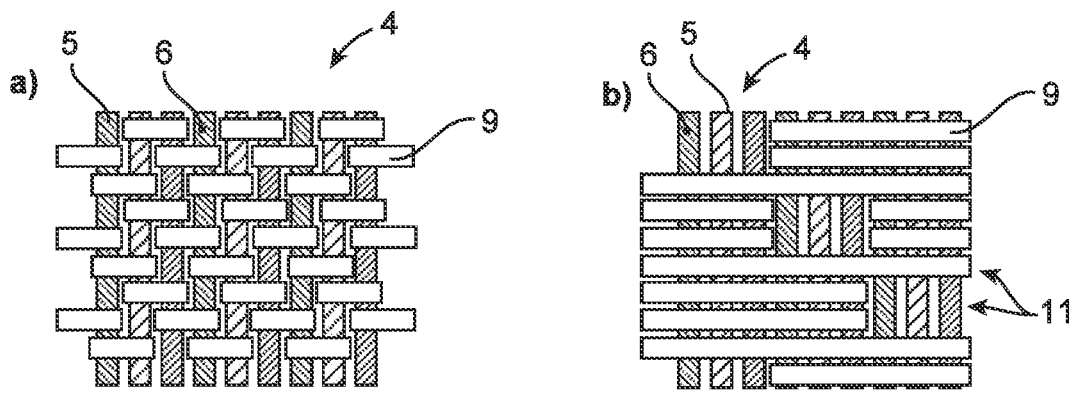
Figure 7:
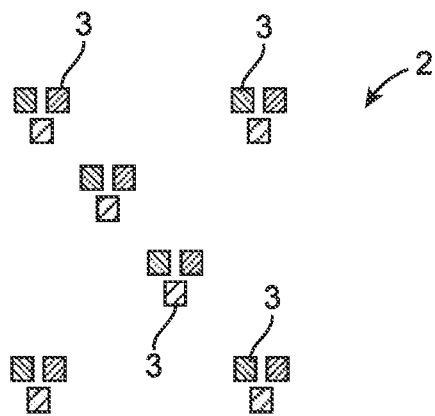
Figure 8:
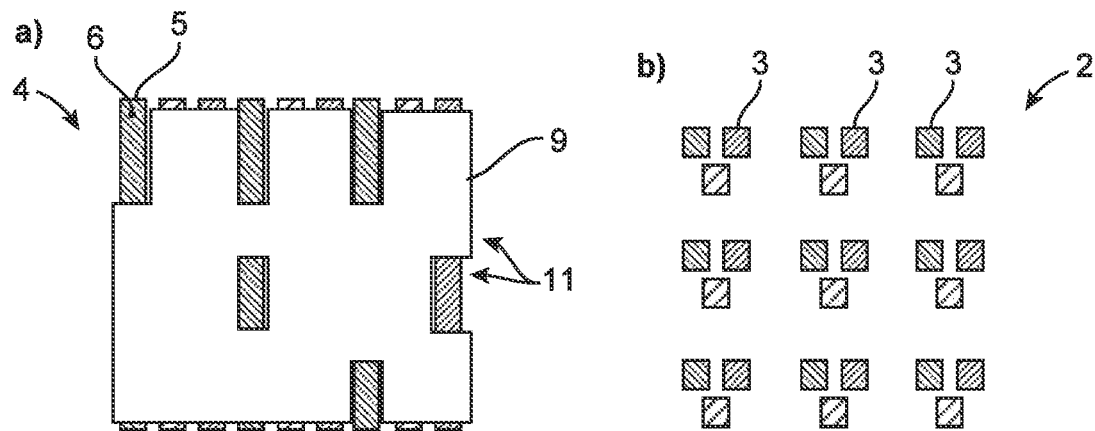
Figure 9:
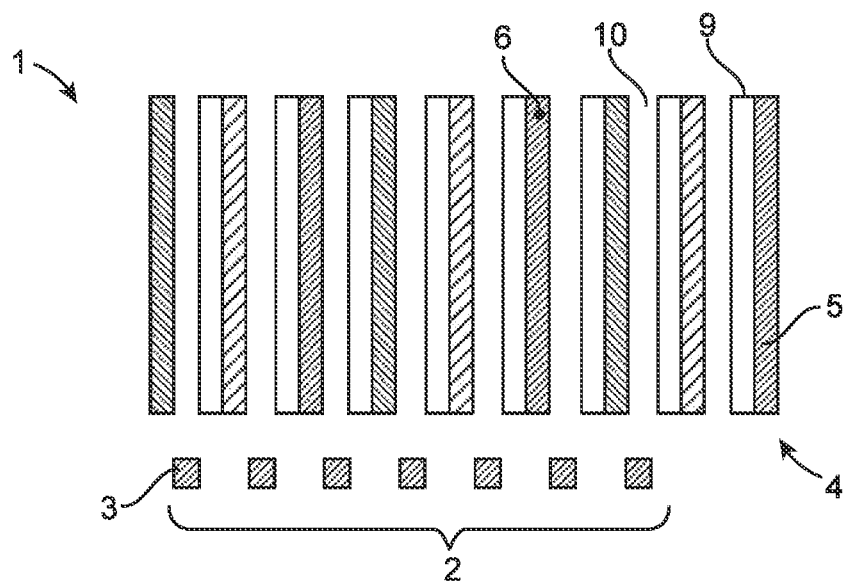
Figure 10:
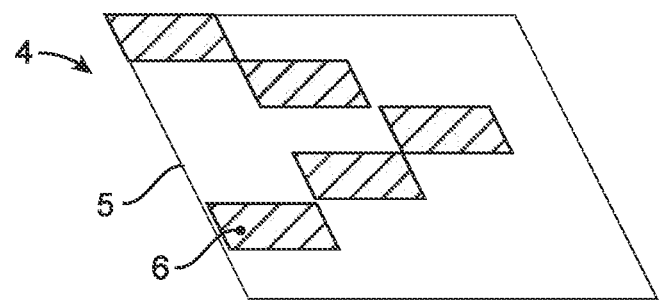
Figure 11:
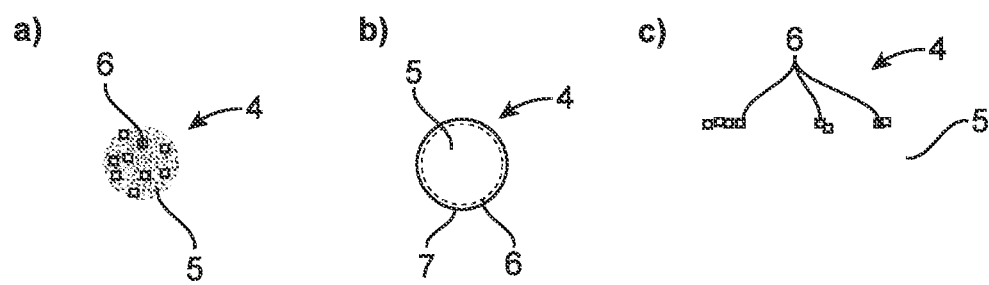
Figure 12:
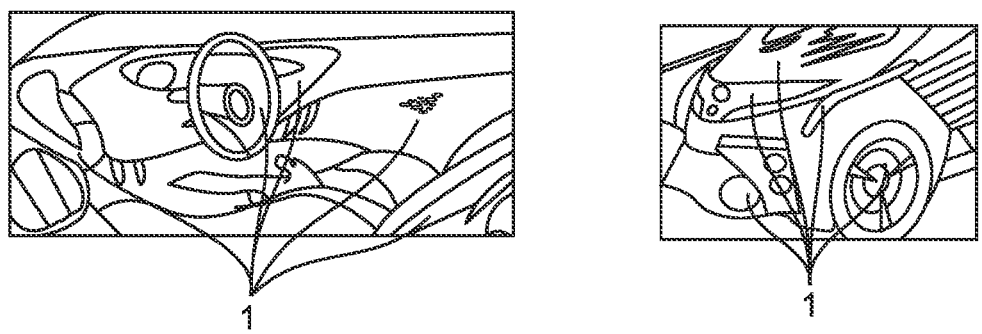

In the following, the invention is explained in more detail, without limiting the general idea of the invention, by means of embodiments and with reference to the figures. Thereby shows:

FIG. 1: a schematic illustration of the various components of a light emitting device according to the invention;

FIG. 2: a light emitting device with a flat converter element uniformly excited for emission and with a cover element;

FIG. 3: a converter element with luminous elements, which emit light with different wavelengths due to excitation by an excitation radiation;

FIG. 4: a converter element with a plurality of luminous elements and cover elements arranged in individual beam paths as required;

FIG. 5: a light emitting device with different radiation element sources of a radiation source, which emit light of different wavelengths and thereby excite a plurality of luminous elements to emit light of different wavelengths;

FIG. 6: different arrangements consisting of luminous elements emitting light of different wavelengths and cover elements partially inserted into the beam paths;

FIG. 7: a special arrangement of different radiation elements of a radiation source for a light emitting device according to the invention;

FIG. 8: a combination of a special arrangement of different radiation elements of a radiation source with a mask-shaped cover element;

FIG. 9: a light emitting device with luminous elements, light guiding element and cover elements for targeted beam guidance and generation of colored patterns;

FIG. 10: a flat luminous element on which a converter material is printed according to the desired pattern;

FIG. 11: different variants of the distribution of the converter material in or on a luminous element; and FIG. 12: a schematic illustration of the possible uses of a light emitting device according to the invention in a passenger car.

FIG. 1 shows a schematic illustration of the various components of a light emitting device 1 according to the invention. The light emitting device 1 comprises a radiation source 2 with at least one radiation element 3 which emits electromagnetic radiation, for example with a wavelength between about 380 and 490 nm, i.e. in the blue and violet spectral range. Furthermore, a converter element 4 is provided, which in the embodiment shown here comprises a yarn, twine or thread, which is preferably endless, as a luminous element 5.

A suitable converter material 6 is arranged on or within the yarn, thread or yarn serving as the luminous element 5 of the converter element 4, which emits visible light due to excitation by the electromagnetic radiation emitted by the radiation source 2.

It can be clearly seen from the illustration in FIG. 1 that a significant advantage of the light emitting device 1 according to the invention is that it is particularly flexible due to the use of a luminous element 5, which comprises at least one textile, and can thus be designed, shaped and arranged according to requirements. In addition, the use of continuous material, which is preferably provided on rolls, enables a comparatively effective and inexpensive production of a converter element 4 for a light emitting device 1 designed according to the invention.

FIG. 2 shows a special embodiment of a light emitting device 1 according to the invention, which comprises a converter element 4 of a flat design. In this case, the radiation source 2 of the light emitting device 1 comprises a plurality of radiation elements 3, preferably LEDs, which emit electromagnetic radiation in the blue or violet spectral range. The radiation emitted by the individual radiation elements 3 designed as LEDs impinges laterally on the planar converter element 4, the size of which can be varied as required.

The converter element 4 comprises a luminous element 5 which is impregnated or coated with a converter material 6, so that the flat converter element 4 emits visible light into the environment over a comparatively large area due to the excitation by the radiation emitted by the various LEDs. It is essential here that the radiation of the light from the converter element 4 into the environment takes place at least for the most part in a direction in which no LEDs of the radiation source 2 are located. This means that the surface region of the converter element 4 on which the excitation radiation of the radiation source 2 impinges is different from that over which the visible light is emitted from the converter element 4 in the direction of the environment.

The converter element 4 shown in FIG. 2 comprises a textile of a flat design, for example a woven or knitted textile or a thin felt mat. It is also conceivable that the converter element 4 comprises a comparatively thin, preferably flexible plastic substrate which is coated with a suitable converter material 6 or into which such a converter material 6 is introduced. The textile or plastic used for the converter element 4 is selected in such a way that it is transparent, or at least translucent, to the excitation radiation and preferably to the emitted visible light.

Otherwise, the light emitting device shown in FIG. 2 comprises a plate-shaped, transparent or at least translucent substrate 7 which serves as a protective layer for the light emitting device 1, in particular the converter element 4 and the radiation source 2. The visible light emitted by the converter element 4 in the direction of the environment first impinges on the back surface of the substrate 7, at least partially radiates through it and then emerges into the environment via a front side of the substrate, which in this case forms the visible surface 8 of the light emitting device 1. The light emitting device 1 shown can thus be used in a particularly preferred manner for illumination, in particular for effective illumination of an interior, for example a vehicle interior.

The radiation elements 3 can couple the light emitted by them into a side surface of a flat light guide (not shown), which is arranged in the image plane behind the substrate 7 and the converter element 4 or the luminous element 5. The light guide can be designed as a rectangular, in particular transparent, plate, comparable to the substrate 7. This allows the back surface of the converter element 4 to be homogeneously illuminated.

In FIG. 3, a further special embodiment of a converter element 4 is shown, as it can be used for a light emitting device 1 according to the invention. The converter element 4 shown is excited by means of a radiation source 2 not shown here, which preferably comprises several radiation elements, can be arranged behind or next to the converter element 4 and emits monochromatic radiation or light of a specific wavelength, in such a way that various luminous elements 5 of the converter element 4 are excited to emit visible light due to the incident excitation radiation. In the embodiment shown, the excitation takes place in such a way that the individual luminous elements 5 of the converter element 4 each emit light with the colors red, green or blue. The luminous elements 5 are formed as parallel filaments impregnated or coated with a suitable converter material 6. By the suitable combination of different luminous elements 5 in a converter element 4, almost all colors can be generated and thus light with the respective desired color or, for example, separated according to regions with different colors can be emitted into the environment via the visible surface 8 of a light emitting device 1 according to the invention. In this context, it is generally conceivable to coat or impregnate the individual luminous elements 5 with different converter materials 6 and/or to excite a converter material 6 with radiation of different wavelengths as required, depending on the desired color of the emitted light.

Due to the electromagnetic radiation preferably impinging on the back surface of the luminous elements 5, the individual filamentary luminous elements 5 are excited to emit visible light, here in the characteristic colors red, green and blue of the RGB color space, so that this light is emitted in the direction of an environment of the light emitting device 1. FIG. 3 shows a special design of a converter element 4, which is characterized by the fact that, on the one hand, luminous elements are excited to emit light of three different specific wavelengths and that, on the other hand, two layers 11 of luminous elements 5 are arranged in single regions in a plane-parallel manner one above the other. Furthermore, both within the upper and the lower layer 11, several filamentary luminous elements 5 are partially combined to form a cluster 12 which emits light of the same wavelength. According to FIG. 3, the upper of the two layers 11 comprises two clusters 12, one of which emits red light and the other blue light in the direction of the environment.

Thus, the converter element 4 shown in FIG. 3 is formed in such a way that the luminous elements 5 arranged in the upper layer 11 facing the environment are excited in such a way that they emit blue or red light respectively, while the luminous elements arranged in parallel in the lower layer 11 emit red, blue or green light. In addition, in the shown embodiment, the main extension direction of the luminous elements of one layer 11 is rotated by 90° with respect to the main extension direction of the layer 11 located in the respective other plane.

The solution shown in FIG. 3 makes it clear that a converter element 4 of a light emitting device 1 according to the invention can comprise a plurality of different luminous elements 5, which are coated or impregnated with different converter material 6 as required and/or can be arranged or formed in such different ways that specifically desired patterns and luminous indications can be displayed on a visible surface 8 of the light emitting device 1 facing the environment.

FIG. 4 further shows a special converter element 4 in which, in addition to the luminous elements 5, cover elements 9 are provided which absorb the light emitted by the luminous elements in a specific direction in each case. According to the embodiment shown in FIG. 4, individual luminous elements 5 arranged side by side are arranged parallel to each other in a lower plane of the converter element 4 and are excited to emit red light by a radiation source 2 which is not shown and which may be arranged below or next to the converter element 4 with respect to the environment, in particular a space to be illuminated. In this case, individual cover elements 9 in the form of filaments are provided on both sides of the red-emitting luminous elements 5, which are in turn combined to form a cluster 12, and absorb light emitted by the luminous elements 5 in these regions. Preferably, the threads used for the cover element 9 comprise the same textile material as the luminous elements 5, although no converter material 6 is provided in or on the threads of the cover element 9.

On the other hand, further cover elements 9 are provided in an upper layer 11 between the red luminous luminous elements 5 of the converter element 4 and the environment, which absorb the red light emitted by the luminous elements 5 in the direction of the environment, so that in the regions in which corresponding cover elements 9 are located in the upper layer 11, no red light escapes into the environment.

With this particular embodiment of a converter element 4, as can be used for a light emitting device 1 according to the invention, it is again possible to generate special patterns or lettering which are emitted via a visible surface 8 of the light emitting device 1 facing the environment and can be perceived, for example, in the passenger compartment of a water, land or air vehicle.

FIG. 5 shows a light emitting device 1 according to the invention, which comprises a radiation source 2 with a plurality of radiation elements 3. In this case, the radiation elements 3 of the radiation source 2 are formed as individual LEDs that emit light with the three colors characteristic of the RGB color space, namely red, green or blue light. The light with different wavelengths emitted by the radiation source 2 impinges laterally on the individual, parallel luminous elements 5 of a converter element 4. In this case, the luminous elements 5 are individual filaments impregnated or coated with appropriately suitable converter material 6. Using the specially selected radiation elements 3 as well as the respective converter material 6, the individual luminous elements 5 emit red, green or blue light in the direction of the visible surface 8 of the light emitting device 1 facing an environment. It is essential here again that the excitation radiation impinges in each case via a first surface on the luminous elements 5 of the converter element 4, while the visible light excited thereby is emitted via a second surface, which differs at least to a large extent from the first, in the direction of the visible surface 8 of the light emitting device 1. On the basis of the generation of the three different colors characteristic of the RGB color space, it is possible in a preferred manner to mix light of different wavelengths and/or to emit light of different colors from the light emitting device 1 into the environment or to adapt the light propagation as required in such a way that desired patterns are recognizable on the visible surface 8 of the light emitting device 1.

In the embodiment according to FIG. 5, the light emitting device 1 further comprises a substrate 7 forming a protective layer or cover, which protects both the converter element 4 and its luminous elements 5 and the radiation source 2 with its radiation elements 3 from damage and the penetration of dirt and moisture from the environment. The visible light emitted by the individual luminous elements 5 of the converter element 4 impinges on a back surface of the transparent or at least translucent substrate 7, here in the form of a plate-shaped cover element, for example of acrylic glass, at least partially radiates through the substrate 7 and emerges into the environment via the surface of the substrate 7, which in this case forms the visible surface 8 of the light emitting device 1 facing the environment. By specific selection of a material for the substrate 7 or structuring of the substrate 7, which, as shown in FIG. 5, can form the cover of a light emitting device 1 according to the invention, special optical effects or patterns can in turn be created as required, in particular by redirecting or shaping the individual beam paths of the emitted visible light.

Similar to the device of FIG. 2, the radiation elements 3 can also couple the light emitted by them into a side surface of a flat light guide, which is arranged in the image plane behind the substrate 7 and the converter element 4 or the luminous elements 5 (not shown). The light guide can again, comparable to the substrate 7, be designed as a rectangular, in particular transparent, plate, by means of which a homogeneous illumination of the luminous elements 5 is possible.

FIG. 6 six shows in the two illustrations 6a) and 6b) special designs of a converter element 4 which can be used according to the invention and with which special patterns can be output via a visible surface 8 of a light emitting device 1 according to the invention.

FIG. 6a) shows a converter element 4 which comprises a plurality of luminous elements 5 which have been excited to emit visible light of different wavelengths, namely in the colors red, green and blue, by radiation from a radiation source 2 which is not shown here and is preferably located behind the converter element 4. The individual luminous elements 5 are threads or yarns which have been coated or impregnated with a suitable converter material 6. Furthermore, the converter element 4 shown in FIG. 6a) is characterized by the fact that threads have been selectively interwoven with the luminous elements 5, which assume the function of cover elements 9. These thread-like cover elements 9, which are located both between the individual luminous elements 5 and above them, absorb, at least in certain regions, the visible light emitted by the individual luminous elements 5, so that in turn a special pattern can be displayed on the visible surface 8, facing an environment, of the light emitting device 1 equipped with the converter element 4 shown. In this context, it is conceivable that the cover elements 9 are threads which comprise the same textile material as the luminous elements 5, but have not been provided with converter material 6.

FIG. 6b) shows a further special embodiment, in which the cover elements 9 have been arranged differently in relation to the individual luminous elements 5 of the converter element 4 and applied to the luminous elements 5 than is the case in the embodiment shown in FIG. 6a).

According to the embodiment shown in FIG. 6b), the individual threads forming the cover element 9 are not interwoven with the luminous elements 5 of the converter element 4, but are arranged in a parallel position in the beam paths running between the individual luminous elements 5 and the environment. The cover elements 9 shown in FIG. 6b) can generally comprise threads, yarns, textile fibers or synthetic fibers which absorb the visible light emitted by the individual luminous elements 5. For this purpose, the cover elements 9 can be glued, welded or otherwise fixed to the luminous elements 5 in a flat, linear or punctiform manner. Based on the embodiments of the invention shown in FIG. 6, it is clear that by suitable selection and arrangement of cover elements 9, for the manufacture of which continuous material is preferably used, it is comparatively easy to output different patterns or even lettering to the environment via the visible surface 8 of a light emitting device 1 according to the invention. A particular advantage here is that the converter elements 4 shown are very flexible in terms of shape and require only a comparatively small installation space that is flat with respect to the direction of light propagation.

In addition to FIG. 6, FIG. 7 shows a possible arrangement of various radiation elements 3 of a radiation source 2, which can be used in an advantageous manner for a light emitting device 1 according to the invention. As can be seen in FIG. 7, the individual radiation elements 3 can be selected on the one hand in such a way that they emit radiation, for example visible light of different wavelengths, and on the other hand can be arranged at a distance from one another according to a desired pattern. With the aid of a radiation source 2, which comprises the radiation elements 3 shown in FIG. 7 and arranged at a distance from one another, which emit light with different wavelengths, a radiation source 2 can be provided, for example, which can be used in an advantageous manner for background illumination of a converter element 4, which comprises luminous elements 5 with textile or plastic material, in or on which converter material 6 is provided. Preferably, both the luminous elements 5 of the converter element 4 and the radiation elements 3 of the radiation source 2 are designed in such a way that they emit visible light with the colors characteristic of the RGB color space.

FIG. 8 shows in FIG. 8a) an arrangement comprising, on the one hand, a converter element 4 which comprises individual filamentary luminous elements 5 emitting red, green or blue light and, on the other hand, a specially shaped mask as a cover element 9 which absorbs the light emitted by the luminous elements in large regions between individual recesses. According to the embodiment shown, in particular by using suitably shaped masks as cover element 9 for partial shielding or covering of the converter element 4, it is possible to selectively display patterns, objects or lettering on the visible surface 8 facing the environment of a light emitting device 1 according to the invention, which can be perceived in the environment, for example in the interior of a vehicle.

In addition, it is conceivable to use the design and arrangement of individual radiation elements 3 shown in FIG. 8*b*), for example for background illumination of the converter element 4 shown in FIG. 8*a*). With the aid of the individual radiation elements 3, the luminous elements 5 of the converter element 6 are specifically excited to emit light with the desired wavelength, in this case to emit red, green or blue radiation. Due to the provision of a mask-shaped cover element 9, it is then achieved that the light generated by excitation is only emitted into the environment if there is no cover element between the converter element 4 and the environment or if there is a recess in the cover element 9.

Through the targeted excitation of luminous elements 5 with the aid of specially selected and arranged radiation elements 3 on the one hand and the need-based design of the cover element 9 on the other hand, almost any pattern, object or lettering can be displayed on the visible surface 8 facing the environment of a light emitting device 1 according to the invention.

Furthermore, FIG. 9 shows a very special embodiment of a light emitting device 1 according to the invention. First of all, a radiation source is provided at the side of the converter element 4, which comprises a plurality of LEDs as radiation elements 3. The LEDs emit blue or violet light with a wavelength between about 380 and 490 nm.

According to the embodiment shown, the excitation radiation emitted by the radiation elements 3 is guided to the individual filamentary luminous elements 5 with the aid of optical waveguides used as light guide elements 10. For this purpose, individual optical waveguides are arranged as light guide elements between the individual, parallel luminous elements, which can be designed as a thread, yarn or rope, which guide the excitation radiation specifically from the individual LEDs of the radiation source 2 to the luminous elements 5 of the converter element 4. The excitation radiation thus passes from the radiation source 2 via a light guide element 10, which comprises a plurality of light waveguides, to the individual luminous elements 5 and is coupled here via a first, lateral surface into the respective luminous element 5 provided.

Excited by the incident or coupled radiation, the individual luminous elements 5 arranged parallel to each other emit visible light with the colors red, green and blue, as they are characteristic for the RGB color space. The visible light generated by excitation of the luminous elements 5 or the converter material 6 is in turn emitted via a second surface of the luminous element 5 in the direction of the environment, so that the correspondingly colored light can be perceived in the environment.

A further feature of the embodiment shown in FIG. 9 is that cover elements 9 in the form of threads, yarns or ropes are additionally provided, which are arranged parallel between the individual luminous elements 5 and optical waveguides of the light guide element 10. With the aid of the cover elements 9 it is ensured that on the one hand the excitation radiation conducted through the optical waveguides is coupled only into the respective luminous element 5 provided for this purpose, and that on the other hand the light emitted by the individual luminous elements 5 does not impinge on one of the neighboring luminous elements. The formation of undesirable color effects due to optical crosstalk of excitation radiation and/or the light emitted by a luminous element 5 into an adjacent luminous element 5 is reliably prevented in this way.

This embodiment of the invention again makes it possible to provide a light emitting device 1 which enables particularly uniform illumination of the visible surface 8 facing an environment. In addition, patterns, objects or lettering can be displayed in a suitable manner on a visible surface 8 of a light emitting device 1 according to the invention, which can be perceived in the environment.

FIG. 10 shows a further special embodiment of a converter element 4, such as can be used for a light emitting device 1 according to the invention. The converter element 1 comprises a flat luminous element 5, which is, for example, a piece of felt, a fabric or a thin plastic substrate. A converter material is selectively printed onto this flat luminous element 5, which comprises a textile or a plastic, at the required or selected points. In an advantageous manner, the luminous element 5, in particular the felt, the fabric or the knitted fabric used, is transparent or at least translucent for the excitation radiation which impinges on the luminous element 5 from a radiation source 2 arranged on the back surface of the luminous element 5. Thereupon, the excitation radiation passes at least partially through the luminous element 5, so that finally the converter material 6 arranged on the surface of the converter element 4 is excited to emit visible light. In this case, the desired pattern of the light emitted by the luminous element can be produced by suitable coating or printing of the converter material 6 on the flat converter element 4.

FIG. 11 shows again for clarification in three views the different possibilities of applying the converter material 6 required for the emission of visible light onto or into a luminous element 5 of the converter element 4. It is always essential for the invention that the luminous element 5 comprises a textile or a plastic as a carrier on or in which the converter material 6 is arranged. According to the embodiment example shown in FIG. 11*a*), the luminous element 5 is a thread or yarn impregnated with a converter material 6, so that the converter material 6 is distributed at least almost uniformly within the luminous element 5, i.e. within the thread or yarn.

FIG. 11*b*) further shows an embodiment in which a textile or plastic thread has been provided with a suitable converter material 6 by way of a printing or coating process. According to this embodiment, the converter material 6 is located on the surface of the luminous element 5, fully surrounding the textile or plastic thread.

In order to protect the filamentary luminous element 5 from external influences, for example from contamination, moisture and/or damage, a substrate 7 has been applied to the converter material 6 as a protective layer. This protective layer is in turn transparent or at least translucent for the excitation radiation as well as the visible light emitted by the converter material 6 due to the excitation.

Moreover, FIG. 11*c*) shows an embodiment in which the converter material 6 has been applied to a plurality of textile or plastic threads serving as luminous elements 5. In this case, the converter material 6 does not completely surround the individual filamentary luminous elements 5, but has been applied, preferably selectively in individual regions, for example by a printing process, to the surface of the luminous element 5. Here it becomes clear that according to the invention it is also possible to use a textile or a thin flexible plastic material for the converter element 4, on which the required converter material 6 is applied as needed, for example to make special patterns, objects or lettering visible in the environment.

The light emitting device which is subject of the invention, as well as all special embodiments which are based on the idea essential to the invention, can be used in an advantageous manner for the representation of illuminated points, lines or surfaces, light objects, patterns or even lettering on exterior walls or cladding elements of buildings, electrical devices or vehicles. By way of example, FIG. 12a) shows a part of the interior of a passenger car which is illuminated in various ways by light emitting devices according to the invention which are integrated in cladding elements, the outer skin of the seat, the steering wheel and the dashboard. Likewise, light emitting devices according to the invention, as shown in FIG. 12b), can also be integrated into components of a vehicle outer skin, in particular the vehicle body. In any case, light emitting devices according to the invention can be used both to increase safety and to implement special design features.

REFERENCE LIST

1 Light emitting device
2 Radiation source
3 Radiation element
4 Converter element
5 Luminous element
6 Converter material
7 Cover substrate
8 Visible surface
9 Cover element
10 Light guide element
11 Position of luminous and/or cover elements
12 Cluster of luminous and/or cover elements

The invention claimed is:
1. A light emitting device, comprising:
at least one radiation source for the emission of electromagnetic radiation having a first wavelength, and
a converter element on which the electromagnetic radiation impinges in a first surface region of the converter element and which, when excited by the impinged electromagnetic radiation, emits visible light having a second wavelength different from the first wavelength into an environment by way of a second surface region of the converter element which is different from the first surface region,
wherein
the converter element comprises at least two luminous elements comprising a first luminous element and a second luminous element,
each of the at least two luminous elements comprises a yarn, twine and/or rope,
the yarn, twine and/or rope of the first luminous element is coated or impregnated with a first converter material,
the yarn, twine and/or rope of the second luminous element is coated or impregnated with a second converter material,
in response to being excited by the electromagnetic radiation having the first wavelength, the first luminous element and the second luminous element respectively emit visible light having different colors that mix to form the visible light emitted by the converter element into the environment,
the radiation source realizes a background illumination for the converter element,
the first surface region is formed by a back surface of the converter element, and
the second surface region is a visible surface of the light emitting device that faces away from the radiation source.
2. The light emitting device according to claim 1, wherein the converter element comprises a woven fabric, knitted fabric, knitted mesh, stitch-bonded fabric, nonwoven fabric and/or felt, on and/or in which the converter material is arranged.
3. The light emitting device according to claim 1, wherein the luminous element comprises acrylonitrile butadiene styrene (ABS), polyethylene terephthalate (PET) and/or polyurethane (PU) on and/or in which the converter material is coated or impregnated.
4. The light emitting device according to claim 1, wherein at least one of the first converter material or the second converter material is at least partially arranged on a surface of the yarn, twine and/or rope of the first luminous element or the second luminous element.
5. The light emitting device according to claim 4, wherein at least one of the first luminous element or the second luminous element comprises, at least in regions, the first converter material or the second converter material applied to the surface of the yarn, twine and/or rope of the first luminous element or the second luminous element by a coating process and/or a printing process.
6. The light emitting device according to claim 1, wherein at least one of the first converter material or the second converter material is arranged at least partially within the yarn, twine and/or rope of the first luminous element or the second luminous element.
7. The light emitting device according to claim 1, wherein at least one of the first luminous element or the second luminous element is covered, at least in regions, on a second surface region side of the converter element by a transparent or translucent substrate.
8. The light emitting device according to claim 7, wherein the substrate comprises glass and/or plexiglass and/or a transparent or translucent plastic and/or silicone or epoxy resin and/or hybrid materials of silicone and epoxy resin.
9. The light emitting device according to claim 1, wherein the at least one radiation source comprises at least two radiation elements emitting electromagnetic radiation of different wavelengths, the converter element comprises at least two non-overlapping luminous regions, and eahc of the at least two radiation elements is assigned to a corresponding one of the at least two non-overlapping luminous regions in such a way that the electromagnetic radiation emitted by one of the at least two radiation elements impinges only on the corresponding one of the at least two non-overlapping luminous regions such that no electromagnetic radiation emitted by the at least two radiation elements impinges on a non-corresponding one of the at least two non-overlapping luminous regions.
10. The light emitting device according to claim 1,
wherein the at least one radiation source comprises at least two radiation elements emitting electromagnetic radiation of different wavelengths, the converter element comprises at least two non-overlapping luminous regions, and each of the at least two radiation elements is assigned to a corresponding one of the at least two non-overlapping luminous regions in such a way that a first peak wavelength of the electromagnetic radiation emitted by a first one of the at least two radiation elements is matched to the corresponding one of the at least two non-overlapping luminous regions assigned to the first one of the at least two radiation elements and a second peak wavelength of the electromagnetic radiation emitted by a second one of the at least two radiation elements is matched to the corresponding one of the at least two non-overlapping luminous regions assigned to the second radiation element.

11. The light emitting device according to claim 1, wherein
the converter element comprises at least three luminous elements comprising the first luminous element, the second luminous element, and a third luminous element,
in response to being excited by the electromagnetic radiation having the first wavelength, the third luminous element emits visible light having a color that differs from the colors of the light respectively emitted by the first luminous element and the second luminous element,
the colors of the light emitted by the first luminous element, the second luminous element and the third luminous element respectively correspond to a primary color in the red, green, blue color space, and
the at least three luminous elements are arranged such that the visible light emitted into the environment by the converter element is a mixture of the visible light emitted by the at least three luminous elements.

12. The light emitting device according to claim 1, further comprising:
at least one cover element arranged in a beam path between the at least one radiation source and the converter element and/or between the converter element and the environment, wherein the cover element at least partially absorbs incident radiation.

13. The light emitting device according to claim 1, wherein the at least one radiation source comprises at least one radiation element, wherein the at least one radiation element comprises at least one LED which emits electromagnetic radiation with a wavelength of 380 to 490 nm.

14. The light emitting device according to claim 1, wherein the at least one radiation source comprises at least two radiation elements, wherein each of the at least two radiation elements emits electromagnetic radiation having a peak wavelength different from a peak wavelength of the electromagnetic radiation emitted by a different radiation element, and the peak wavelengths differ by a distance of 10 nm or more from each other.

15. The light emitting device according to claim 1, wherein the at least one radiation source comprises at least two radiation elements arranged distant from each other.

16. The light emitting device according to claim 1, wherein at least one light guide element is provided for guiding, deflecting and/or shaping the incident electromagnetic radiation emitted by the at least one radiation source and/or the visible light emitted by the converter element.

17. An interior cladding of a land, water or air vehicle, or a wall, wall component or cladding element for a wall or a component with a light emitting device according to claim 1.

18. The light emitting device according to claim 1, wherein the color of the visible light emitted by the at least one of the first luminous element and the second luminous element is different from a color of the electromagnetic radiation associated with the first wavelength.

19. The light emitting device according to claim 18, wherein the color of the visible light emitted by both of the first luminous element and the second luminous element is different from the color of the electromagnetic radiation associated with first wavelength.

20. The light emitting device according to claim 1, wherein the converter element comprises a plurality of first luminous elements and a plurality of second luminous elements, and the first luminous elements and the second luminous elements are arranged parallel to one another in the converter element.

* * * * *